United States Patent [19]
Hirata et al.

[11] Patent Number: 5,329,068
[45] Date of Patent: Jul. 12, 1994

[54] SEMICONDUCTOR DEVICE

[75] Inventors: Seiichi Hirata, Yokosuka; Akito Yoshida, Chigasaki, both of Japan

[73] Assignee: Kabushiki Kaisha Toshiba, Kawasaki, Japan

[21] Appl. No.: 73,510

[22] Filed: Jun. 9, 1993

[30] Foreign Application Priority Data

Jun. 10, 1992 [JP] Japan .................. 4-150798

[51] Int. Cl.$^5$ .............................................. H05L 1/02
[52] U.S. Cl. ................... 174/261; 361/767; 174/250
[58] Field of Search ............ 174/250, 255, 260, 261; 361/400, 401, 403, 409, 767

[56] References Cited

U.S. PATENT DOCUMENTS

| | | | |
|---|---|---|---|
| 4,461,077 | 7/1984 | Hargis | 174/261 X |
| 4,860,442 | 8/1989 | Ainsworth et al. | 174/250 X |
| 5,004,314 | 4/1991 | Jackson et al. | 361/400 X |

FOREIGN PATENT DOCUMENTS

| | | | |
|---|---|---|---|
| 232792 | 9/1989 | Japan | 174/250 |
| 251696 | 10/1989 | Japan | 174/250 |

*Primary Examiner*—Leo P. Picard
*Assistant Examiner*—L. Thomas
*Attorney, Agent, or Firm*—Finnegan, Henderson, Farabow, Garrett & Dunner

[57] ABSTRACT

An insulating film is formed on a semiconductor substrate, and an Al electrode pad is provided on the insulating film. The pad is electrically connected to a positive element by means of a signal line. A protection film is formed on the pad and insulating film. First and second openings are formed in the protection film. A barrier metal layer is formed on the inner periphery of the first opening and on the protection film. An Au bump is formed on the barrier metal layer. The Al electrode pad is exposed through the second opening.

6 Claims, 2 Drawing Sheets

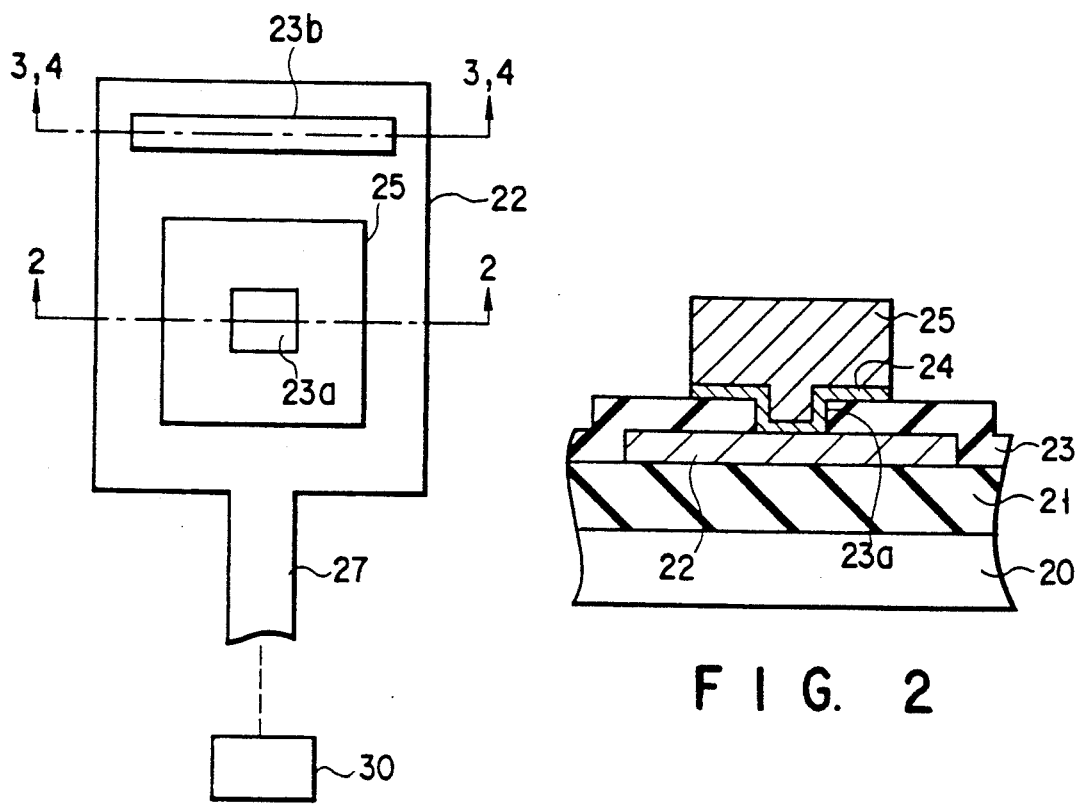
FIG. 1
FIG. 2
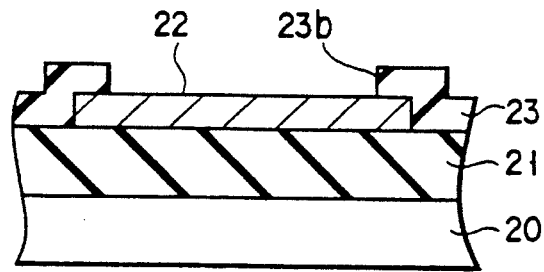
FIG. 3
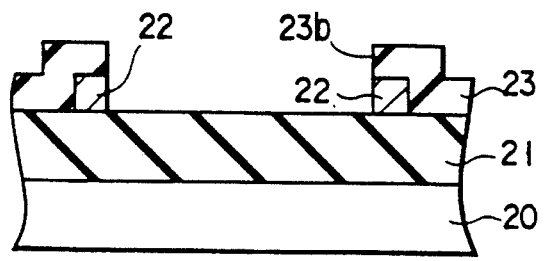
FIG. 4

SEMICONDUCTOR DEVICE

BACKGROUND OF THE INVENTION

1. Field of the Invention

This invention relates to a semiconductor device capable of preventing cracks in the vicinity of electrode pads.

2. Description of the Related Art

FIG. 6 is a plan view showing a conventional semiconductor device. As is shown in FIG. 6, a positive element region 12 is provided on a semiconductor substrate 11, and a plurality of electrode pads 13 are provided thereon around the region 12. Each electrode pad 13 is electrically connected to the region 12 by means of a signal line 14, and also to a package terminal (not shown) by the ILB (Inner Lead Bonding). A source voltage is supplied to the positive element region 12 through the package terminal, thereby supplying input/output signals.

With the development of a technique for refining a positive element provided in the positive element region 12, the integration density in the region 12 has been increased. Therefore, many signal lines and electrode pads are necessary.

FIG. 7 shows a conventional semiconductor device having many electrode pads, in which elements similar to those shown in FIG. 6 are denoted by corresponding reference numerals, and explanation will be given of only different elements.

The number of positive elements provided in a positive element region 15 is larger than that of the elements provided in the region 12 shown in FIG. 6. Accordingly, the numbers of signal lines 14 and electrode pads 13 are larger than those in FIG. 6.

FIG. 8 is an enlarged sectional view, taken along line 8—8 of FIG. 7. A first insulating film 16 is formed on a semiconductor substrate 11. Electrode pads 13 are provided on the first insulating film 16. A second insulating film 17 having openings 17a is formed on the electrode pads 13 and first insulating film 16 such that the openings 17a are arranged above the electrode pads 13.

As is shown in FIG. 7, where many electrode pads 13 are formed, the distance between each adjacent two pads is narrow. Thus, stress exerting upon the first and second insulating films 16 and 17 at the time of the ILB is high. Therefore, as is shown in FIG. 8, cracks 18 and 19 may occur under the electrode pad 13 and between the pads 13. As a result, it is possible for water to sink into the cracks 18 and 19, resulting in a leakage of electricity or corrosion of the pads.

SUMMARY OF THE INVENTION

It is the object of the invention to provide a semiconductor device in which no cracks occur in the vicinity of an electrode pad even if the distance of each adjacent two electrode pads is narrow.

To attain the above object, the semiconductor device of the invention comprises:

a first insulating film formed on a semiconductor substrate;

an electrode pad formed on the first insulating film and electrically connected to a positive element formed on the semiconductor substrate;

a second insulating film provided on the electrode pad;

a first opening formed in the second insulating film;

a bump provided on the inner periphery of the first opening and also on the second insulating film; and a second opening formed in the second insulating film, through which the electrode pad is exposed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plan view, showing an electrode pad portion in a semiconductor device according to a first or second embodiment of the invention;

FIG. 2 is a cross sectional view taken along line 2—2 of FIG. 1, showing the first or second embodiment of the invention;

FIG. 3 is a cross sectional view taken along line 3—3 of FIG. 1, showing the first embodiment of the invention;

FIG. 4 is a cross sectional view taken along line 4—4 of FIG. 1, showing the second embodiment of the invention;

DETAILED DESCRIPTION OF THE PREFERRED EMBODIMENTS

The embodiments of the invention will be explained with reference to the accompanying drawings.

Figure 7:
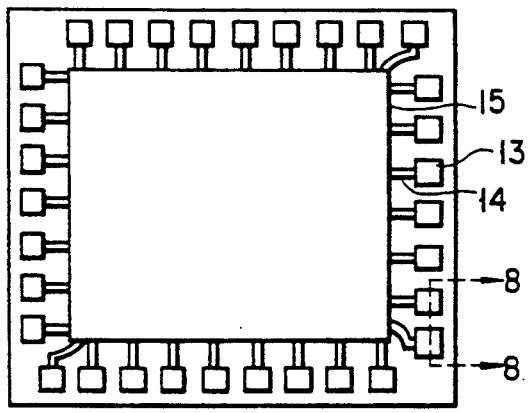
FIG. 7 shows a conventional semiconductor device.
Figure 8:
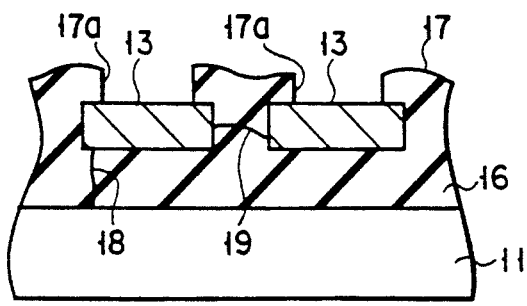
FIG. 8 is an enlarged cross sectional view taken along line 8—8 of FIG. 7.

FIG. 1 shows an electrode pad portion in a semiconductor device according to a first embodiment of the invention. This semiconductor device is similar to that shown in FIG. 7 except for the structure of the electrode pad portion. FIGS. 2 and 3 are cross sectional views taken along lines 2—2 and 3—3 of FIG. 1, respectively.

As is shown in FIG. 2, an insulating film 21 is formed on a semiconductor substrate 20. An Al electrode pad 22 is provided on the insulating film 21. As is shown in FIG. 1, the electrode pad 22 is electrically connected, via a signal line 27, a positive element 30 on the substrate 20. A protection film 23 is deposited on the Al electrode pad 22, signal line 27, and insulating film 21. A first resist film (not shown) serving as a mask is formed on the protection film 23. By etching the first resist film, a first opening 23a and a second opening 23b (shown in FIG. 3) are formed in the protection film 23. The Al electrode pad 22 is exposed through the first and second openings 23a and 23b.

Subsequently, the first resist film is removed and then a barrier metal layer 24 is formed on the protection film 23, and on the inner peripheries of the openings 23a and 23b, as is shown in FIG. 2. A second resist film (not shown) is formed on the barrier metal layer 24. Electroplating is performed while the second resist film is used as a mask, to form an Au bump 25 on the barrier metal layer 24, as is shown in FIGS. 1 and 2. The bump 25 is aligned with the first opening 23a. Thereafter, the second resist film is removed. The bump 25 is used as a mask to etch the barrier metal layer 24. Thus, as is shown in FIG. 3, the Al electrode pad 22 is exposed through the second opening 23b. Then, the bump 25 is electrically connected to a lead (not shown) by the ILB.

In the Al electrode pad portion shown in FIG. 1 and formed as above, the first and second openings 23a and 23b are formed in the protection film 23. The Al electrode pad 22 is exposed through the second opening 23b. The barrier metal layer 24 is formed on the inner periphery of the opening 23a and on the protection film 23. The Au bump 25 is formed on the layer 24.

In the above-described embodiment, during the ILB, a load is applied to the Au bump 25 and also to the Al electrode pad 22 via the barrier metal layer 24. Thus, the pad 22 is deformed. In this case, however, no cracks will occur in the insulating film 21 and protection film 23 under the pad 22 and between the adjacent pads 22, since deformation of the pad 22 is received in the second opening 23b. Accordingly, this semiconductor device is free from leakage which may occur due to water permeating the device through cracks, and also from corrosion of the pad 22 due to the water.

FIGS. 1, 2, and 4 show a second embodiment of the invention, in which elements similar to those employed in the first embodiment are denoted by corresponding reference numerals, and explanation is given of only different elements.

By using the Au bump 25 shown in FIGS. 1 and 2 as a mask, the barrier metal layer 24 is etched, and that portion of the Al electrode pad 22 which is exposed through the second opening 23b is etched.

The second embodiment can provide a similar advantage to that obtained in the first embodiment. Further, since in the second embodiment, that portion of the pad 22 which is exposed through the second opening 23b is removed, the pad 22 can be deformed more easily, i.e., deformation of the pad 22 can be received more easily.

Figure 5:
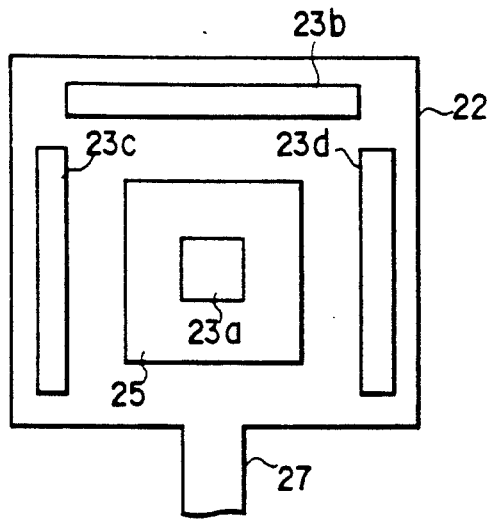
FIG. 5 is a plan view, showing an electrode pad portion in a semiconductor device according to a third embodiment of the invention.
Figure 6:
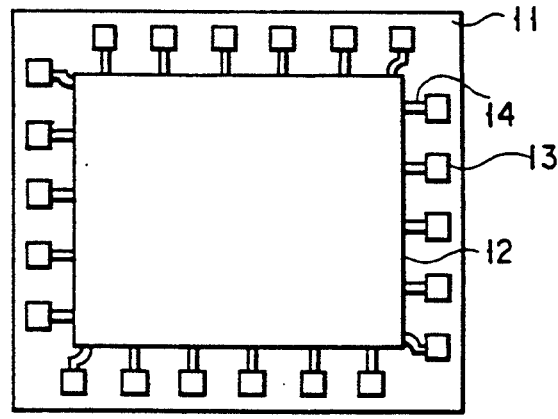
FIG. 6 is a plan view, showing a conventional semiconductor device.

FIG. 5 shows an electrode pad portion of a semiconductor device according to a third embodiment of the invention, in which elements similar to those employed in the first embodiment are denoted by corresponding reference numerals, and explanation is given of only different elements.

The first resist film is used as a mask to etch the protection film 23 and form first through fourth openings 23a-23d. The Al electrode pad 22 is exposed through these openings.

Thereafter, the Au bump 25 is used as a mask to etch the barrier metal layer 24. As a result, the Al electrode pad 22 is exposed through the second to fourth openings 23b-23d.

The third embodiment can provide a similar advantage to that obtained in the first embodiment. Further, the second through fourth openings 23b-23d can further facilitate receipt of deformation of the pad 22.

Although in the third embodiment, the barrier metal layer 24 is etched by using the Au bump 25 as a mask, those portions of the pad 22 which are exposed through the second through fourth openings 23b-23d can be etched while etching the layer 24 by using the bump 25 as a mask.

Moreover, a further opening can be formed in the protection film 23 in the vicinity of the signal line 27, as well as the second through fourth openings 23b-23d.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:
   a semiconductor substrate having a positive element formed thereon;
   a first insulating film formed on the semiconductor substrate;
   an electrode pad formed on the first insulating film and electrically connected to the positive element;
   a second insulating film on the electrode pad, the second insulating film having a first opening; and
   a bump extending within the first opening and overlying the second insulating film;
   the second insulating film including a second opening, the electrode pad being exposed through the second opening.

2. A semiconductor device comprising:
   a semiconductor substrate having a positive element formed thereon;
   a first insulating film formed on the semiconductor substrate;
   an electrode pad formed on the first insulating film and electrically connected to the positive element;
   a second insulating film on the electrode pad, the second insulating film having first and second openings; and
   a bump extending within the first opening and overlying the second insulating film;
   the electrode pad including a third opening, a corresponding portion of the first insulating film located under the second opening being exposed through the third opening.

3. A semiconductor device comprising:
   a semiconductor substrate having a positive element formed thereon;
   a first insulating film formed on the semiconductor substrate;
   an electrode pad formed on the first insulating film and electrically connected to the positive element;
   a second insulating film on the electrode pad, the second insulating film having a first opening; and
   a bump extending within the first opening and overlying the second insulating film;
   the second insulating film including a plurality of second openings and the electrode pad being exposed through the plurality of second openings.

4. A semiconductor device comprising:
   a semiconductor substrate having a positive element formed thereon;
   a first insulating film formed on the semiconductor substrate;
   an electrode pad formed on the first insulating film and electrically connected to the positive element;
   a second insulating film on the electrode pad, the second insulating film having a first opening; and a bump extending within the first opening and overlying the second insulating film, the second insulating film having a plurality of second openings and the electrode pad being exposed through the plurality of second openings;

the electrode pad including at least a third opening, a corresponding portion of the first insulating film located under the second opening being exposed through the third opening.

5. A semiconductor device comprising:

a semiconductor substrate having a positive element formed thereon;

a first insulating film formed on the semiconductor substrate;

an electrode pad formed on the first insulating film and electrically connected to the positive element;

a second insulating film on the electrode pad, the second insulating film having a first opening; and a bump extending within the first opening and overlying the second insulating film, the second insulating film having a second opening and the electrode pad being exposed through the second opening, the second opening receiving deformations of the electrode pad to prevent damage to the electrode pad.

6. A semiconductor device comprising:

a semiconductor substrate having a positive element formed thereon;

a first insulating film formed on the semiconductor substrate;

an electrode pad formed on the first insulating film and electrically connected to the positive element;

a second insulating film on the electrode pad, the second insulating film having a first opening; and a bump extending within the first opening and overlying the second insulating film, the second insulating film having a plurality of second openings and the electrode pad being exposed through the plurality of second openings, the plurality of second openings receiving deformations of the electrode pad to prevent damage to the electrode pad.

* * * * *